United States Patent [19]

Vu et al.

[11] Patent Number: 5,144,526
[45] Date of Patent: Sep. 1, 1992

[54] LOW TEMPERATURE CO-FIRED CERAMIC STRUCTURE CONTAINING BURIED CAPACITORS

[75] Inventors: Thanh Vu, Westminster; Tsen-Tsou Shih, Cypress, both of Calif.

[73] Assignee: Hughes Aircraft Company, Los Angeles, Calif.

[21] Appl. No.: 740,359

[22] Filed: Aug. 5, 1991

[51] Int. Cl.$^5$ .............................. H01G 4/10
[52] U.S. Cl. ............................................ 361/321
[58] Field of Search ............... 361/303, 304, 305, 320, 361/321, 328, 329, 330

[56] References Cited

U.S. PATENT DOCUMENTS

| | | | |
|---|---|---|---|
| 4,800,459 | 1/1989 | Takagi et al. | 361/321 |
| 4,868,711 | 9/1989 | Hirama et al. | 361/321 |
| 4,882,650 | 11/1989 | Maher et al. | 361/321 |

OTHER PUBLICATIONS

I.B.M. Technical Disclosure Bulletin vol. 20 No. 8 Jan. 1978.

*Primary Examiner*—Donald Griffin
*Attorney, Agent, or Firm*—Terje Gudmestad; W. K. Denson-Low

[57] ABSTRACT

A low temperature co-fired ceramic ("LTCC") structure containing capacitors buried therein. To avoid distortion, cracking or bowing during the co-firing process, high K dielectric material is placed between each electrode of each capacitor and low K dielectric is arranged symmetrically with respect to a plane passing through the approximate center of the high K dielectric material. Single as well as multiple stacked capacitors can be successfully buried, all without appreciable distortion, cracking or bowing.

6 Claims, 1 Drawing Sheet

LOW TEMPERATURE CO-FIRED CERAMIC STRUCTURE CONTAINING BURIED CAPACITORS

BACKGROUND OF THE INVENTION

1. Field of The Invention

This invention relates to low temperature co-fired ceramic structures ("LTCC"). More specifically, the invention relates to burying capacitors within LTCC structures.

2. Description of Related Art

There is a strong and growing need for miniaturized electronic circuitry, especially capacitors.

Chip capacitors have been used as part of an effort to meet this need. However, these utilize top level real estate and require labor to assemble and track.

Another solution which has been explored is capstrates. However, these also require additional labor and materials and secondary processing to generate signal interconnections.

Another technology which is rapidly developing uses low temperature co-fired ceramics ("LTCC"). Stacks of LTCC tape are oriented around various electronic components. The resulting structure is then laminated by low temperature firing.

Unfortunately, prior attempts by applicants to incorporate capacitors into an LTCC structure have met with several problems, including distortion, cracking, and bowing of the LTCC structure during co-firing.

SUMMARY OF THE INVENTION

One object of the present invention is to provide a low temperature co-fired ceramic structure ("LTCC") containing a buried capacitor without causing distortion, cracking or bowing during the co-firing process.

Another object of the present invention is to provide a low temperature co-fired ceramic structure ("LTCC") containing a buried capacitor which has a large amount of capacitance per unit of area.

A still further object of the present invention is to provide a low temperature co-fired ceramic structure ("LTCC") containing several buried capacitors stacked on top of one another, again without causing distortion, cracking or bowing during the co-firing process.

These as well as still further objects, features and benefits of the present invention are achieved by burying two electrodes in a low temperature co-fired ceramic structure ("LTCC"), by separating the electrodes with a high K dielectric material, and by surrounding the resulting structure with low K dielectric material arranged symmetrically with respect to a plane passing through the approximate center of the high K dielectric material. Using this design, several capacitors can be buried in a stacked arrangement in a low temperature co-fired ceramic structure ("LTCC"), all without causing harmful distortion, cracking or bowing during the co-firing process.

These as well as still further features, advantages and benefits of the present invention will now become clear upon an examination of the following detailed description, taken in conjunction with the accompanying drawings.

DESCRIPTION OF THE PREFERRED EMBODIMENTS

Figure 1:
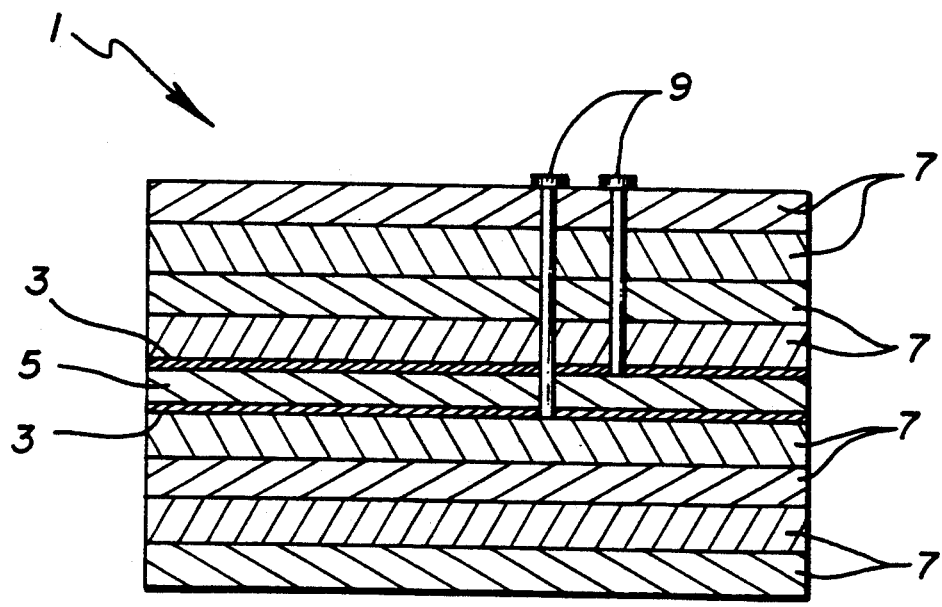
FIG. 1 illustrates one embodiment of the present invention in which a single capacitor is buried in an LTCC structure.

FIG. 1 illustrates one embodiment of the present invention in which a single capacitor is buried in an LTCC structure.

As shown in FIG. 1, an LTCC structure 1 includes a pair of electrodes 3, a high K dielectric 5, low K dielectric 7, and vias 9 electrically connected to the electrodes 3.

Each of the electrodes 3 can advantageously be made by screen printing conductive material, such as silver or gold. High K LTCC tape can advantageously be employed for the high K dielectric 5, as shown in FIG. 1. Low K LTCC tapes can advantageously be employed for the low K dielectric 7, as also shown in FIG. Typical dielectric constants for the low and high K tapes can be 8 and 1000, respectively.

One advantageous technique for constructing the LTCC structure is to stack the necessary materials in successive layers. Appropriate channels for the vias 9 can be made and filled with conductive material. The entire structure is then subjected to low temperature co-firing to laminate it.

Although shown as a single layer, the high K LTCC tape 5 can in fact be several layers. Conversely, although shown as several layers, the low K LTCC tapes 7 can constitute only a single layer on each side of the electrodes 3. To avoid distortion, cracking or bowing during co-firing, the low K LTCC material should be symmetrical with respect to a plane passing through the approximate center of the high K dielectric material 5.

Figure 2:
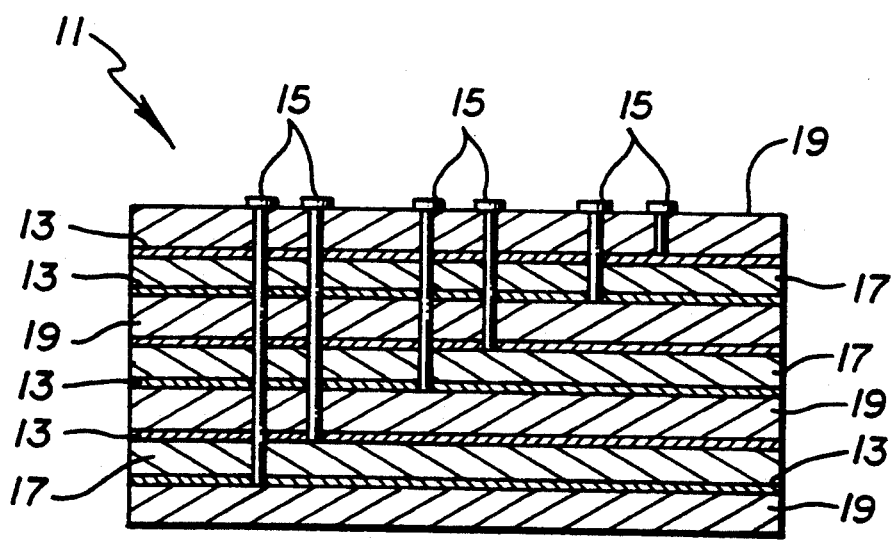
FIG. 2 illustrates an alternate embodiment of the present invention in which several capacitors are stacked and buried in an LTCC structure.

FIG. 2 shows an alternate embodiment of the present invention in which several capacitors are stacked and buried in an LTCC structure.

As shown in FIG. 2, an LTCC structure 11 consists of a plurality of electrodes 13, each connected to a via 15. Each of the electrodes 13 are separated from one another by alternating layers of high K dielectric material 17 and low K dielectric material 19. The same types of materials discussed above in connection with FIG. 1 for the electrodes, dielectrics, and vias can also advantageously be used in the structure shown in FIG. 2.

In order to avoid harmful distortion, cracking or bowing, it is again important that, with respect to each capacitor, the low K dielectric material be arranged symmetrically with respect to a plane passing through the approximate center of the high K dielectric material. To achieve this, the layers enclosing the outermost electrodes should both be of low K material.

Using the techniques described above, applicants have found it is possible to obtain 4 pf to 22,000 pf of capacitance in 0.024 inch to 01.5 in. squares, respectively, without any material bowing, cracking or distortion during the co-firing process.

Although now having discussed various embodiments, it should be obvious to those skilled in the art that the present invention is applicable to a wide variety of additional embodiments. For example, although certain dielectrics have been illustrated as comprising but a single layer of LTCC tape, multiple layers of LTCC tape could be used. Conversely, single layers of LTCC tape could be used in situations where multiple layers are illustrated. It is also not necessary for the electrodes to span the entire width of the LTCC structure. Internal buried connections between capacitors and other capacitors or other electrical components is also contemplated. In short, this invention is limited only by the following claims and their equivalences.

What is claimed is:

1. A low temperature co-fired ceramic structure containing a buried capacitor, said capacitor including:
   a. a first electrode;
   b. a second electrode;
   c. high K dielectric material between said first and second electrode; and
   d. low K dielectric material arranged symmetrically about said first and second electrodes with respect to a plane passing through the approximate center of said high K dielectric material.

2. The structure of claim 1 wherein said high K and low K dielectric materials are low temperature co-fired ceramic tapes.

3. The structure of claim 1 further including a connecting via to each of said electrodes.

4. A low temperature co-fired ceramic structure containing a buried capacitor, said capacitor including:
   a. a first electrode consisting of a plane of screen printed conducting material;
   b. a via connecting with said first electrode;
   c. a second electrode consisting of a plane of screen printed conducting material;
   d. a via connecting with said second electrode;
   e. a high K dielectric between said first and second electrodes consisting of one or more low temperature co-fired ceramic tapes having a high K: and
   f. a first and a second low K dielectric, each consisting of one ore more low temperature co-fired ceramic tapes having a low K, said first and second low K dielectrics being arranged symmetrically about said first and second electrodes with respect to a plane passing through the approximate center of said high K dielectric.

5. A low temperature co-fired ceramic structure containing a plurality of buried capacitors, each of said capacitors comprising:
   a. a first electrode;
   b. a second electrode;
   c. high K dielectric material between said first and second electrode; and
   d. low K dielectric material arranged symmetrically about said first and second electrodes with respect to a plane passing through the approximate center of said high K dielectric material.

6. A low temperature co-fired structure containing a plurality of buried capacitors, said structure including a plurality of planar electrodes, each connected too a via and being separated from one another by alternating planar layers of high and low K dielectric material, the layers of said dielectric material which surround all of said electrodes being of low K dielectric material.

* * * * *